(12) United States Patent
Hashimoto et al.

(10) Patent No.: US 8,670,240 B2
(45) Date of Patent: Mar. 11, 2014

(54) BOARD HOUSING CASE FOR VEHICLE-MOUNTED ELECTRONIC DEVICE

(75) Inventors: Koji Hashimoto, Chiyoda-ku (JP); Isao Azumi, Chiyoda-ku (JP); Yusuke Matsuda, Chiyoda-ku (JP); Yoshitake Nishiuma, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 334 days.

(21) Appl. No.: 13/253,435

(22) Filed: Oct. 5, 2011

(65) Prior Publication Data

US 2012/0320531 A1    Dec. 20, 2012

(30) Foreign Application Priority Data

Jun. 14, 2011   (JP) ................. 2011-132232

(51) Int. Cl.
*H05K 7/20* (2006.01)
*H05K 5/00* (2006.01)

(52) U.S. Cl.
USPC ............ 361/720; 361/704; 361/714; 361/752

(58) Field of Classification Search
None
See application file for complete search history.

(56) References Cited

U.S. PATENT DOCUMENTS

| | | | | |
|---|---|---|---|---|
| 5,403,782 | A * | 4/1995 | Dixon et al. .................. 29/827 |
| 5,408,383 | A * | 4/1995 | Nagasaka et al. ............. 361/707 |
| 5,461,541 | A * | 10/1995 | Wentland et al. ............. 361/707 |
| 5,657,203 | A * | 8/1997 | Hirao et al. .................. 361/707 |
| 5,801,330 | A * | 9/1998 | Gademann et al. ........... 174/559 |
| 6,273,181 | B1 * | 8/2001 | Matsui et al. .................. 165/46 |
| 6,282,092 | B1 * | 8/2001 | Okamoto et al. ............. 361/704 |
| 6,341,066 | B1 * | 1/2002 | Murowaki et al. ............ 361/707 |
| 6,724,627 | B2 * | 4/2004 | Onizuka et al. .............. 361/704 |
| 6,816,377 | B2 * | 11/2004 | Itabashi et al. ............... 361/704 |
| 6,867,968 | B2 | 3/2005 | Katsuro et al. |
| 6,924,985 | B2 * | 8/2005 | Kawakita et al. ............. 361/715 |
| 7,189,082 | B2 * | 3/2007 | Fukushima et al. ......... 439/76.2 |
| 7,244,141 | B2 * | 7/2007 | Yamane et al. .............. 439/485 |
| 7,632,110 | B2 * | 12/2009 | Kanou et al. ................ 439/76.2 |
| 7,697,300 | B2 * | 4/2010 | Brandt et al. ................ 361/736 |

(Continued)

FOREIGN PATENT DOCUMENTS

JP  2003-198165 A  7/2003
JP  2003-258451 A  9/2003

(Continued)

OTHER PUBLICATIONS

Japanese Office Action issued Feb. 5, 2013 in Japanese Patent Application No. 2011-132232.

*Primary Examiner* — Adrian S Wilson
(74) *Attorney, Agent, or Firm* — Sughrue Mion, PLLC

(57) ABSTRACT

A circuit board is hermetically-sealed and housed in a steel case that is composed of a metal base and a metal cover, the cover disposed opposite to a first board surface has a tall flat portion disposed opposite to a connector housing and a short flat portion disposed opposite to a heating component, and the heat generated from the heating component is directly transferred to a heat transfer base portion of the base via a heat transfer mechanism and a heat transfer filling material. Surface finishing in which the coefficients of heat radiation are mutually 0.7 to 1.0 is applied to the surface of the heating component and the opposite inner surface of the cover, and radiation and heat transfer are efficiently performed to the short flat portion of the cover.

16 Claims, 9 Drawing Sheets

(56) References Cited

U.S. PATENT DOCUMENTS

| | | | |
|---|---|---|---|
| 8,356,762 B2 * | 1/2013 | Tomikawa et al. | 237/12.3 R |
| 2003/0045137 A1 * | 3/2003 | Yamane et al. | 439/76.2 |
| 2003/0117776 A1 | 6/2003 | Katsuro et al. | |
| 2003/0161110 A1 * | 8/2003 | Spasevski et al. | 361/715 |
| 2003/0169572 A1 * | 9/2003 | Jakob et al. | 361/752 |
| 2005/0047095 A1 * | 3/2005 | Tomikawa et al. | 361/715 |
| 2007/0195504 A1 * | 8/2007 | Tomikawa et al. | 361/715 |

FOREIGN PATENT DOCUMENTS

| | | |
|---|---|---|
| JP | 2007-184428 A | 7/2007 |
| JP | 4091568 B2 | 5/2008 |
| JP | 2009-124023 A | 6/2009 |
| JP | 2010-123787 A | 6/2010 |

* cited by examiner

|  | Aluminum cover | Aluminum base | Allowable dissipation | Improvement effect |
|---|---|---|---|---|
| Normal | Basis material | Basis material | 3.7W | Standard |
| Sample1 | Black coating | Basis material | 5.1W | Large |
| Sample2 | Black coating | Black coating | 4.9W | Medium |
| Sample3 | Basis material | Black coating | 3.5W | Deterioration |

(A)

(B)

(C)

US 8,670,240 B2

BOARD HOUSING CASE FOR VEHICLE-MOUNTED ELECTRONIC DEVICE

BACKGROUND OF THE INVENTION

1. Field of the Invention

The present invention relates to improvements of board housing cases relevant to electronic circuit boards, for example, for vehicle-mounted electronic control devices and, more particularly, relates to an improved structure of a board housing case for a vehicle-mounted electronic device in which the heat generated from heating components mounted on a circuit board is efficiently diffused to a steel case by heat transfer and radiation to perform heat dissipation from both of a pair of a base and a cover that constitute the steel case to outside the case.

2. Description of the Related Art

A circuit board mounted with heating components is hermetically-sealed and housed in a steel case that is composed of a base and a cover, the heat generated from the heating components is transferred by coming into contact with the base or the cover via a heat transfer material and the generated heat is made to indirectly dissipate as the radiated heat to the inner surface of the base or the cover, the inner surface being coated in black; and accordingly, a temperature rise of the heating components is suppressed.

For example, as a conventional one, according to "ELECTRONIC CONTROL DEVICE FOR ENGINE CONTROL" disclosed in the following Patent Document 1, a circuit board mounted with a plurality of heating components is hermetically-sealed and housed in a steel case that is composed of a cover (referred to as a "base" in the present application) and a case (referred to as a "cover" in the present application) and the generated heat of a major heating component provided on the cover (base) side is transferred by coming into contact with the cover (base) via a heat transfer material. At the same time, the generated heat is made to indirectly dissipate as the radiated heat by coating the inner surface of the cover (base) in black and the generated heat of a small heating component provided on the case (cover) side is further made to indirectly dissipate to the inner surface of the case (cover) coated in black as the radiated heat; and accordingly, a temperature rise of the heating component is suppressed.

In addition, as other conventional one, according to "ELECTRONIC DEVICE" disclosed in the following Patent Document 2, a circuit board mounted with a heating component is hermetically-sealed and housed in a steel case that is composed of a base and a case (referred to as the "cover" in the present application) and the generated heat of the heating component provided on the case (cover) side is transferred by coming into contact with the base disposed on the opposite surface via a heat transfer material. In this case, any heat radiation to the inner surface of the base or the case (cover) is not taken into consideration. Incidentally, the case (cover) is formed in an uneven shape of a tall flat portion and a short flat portion and the heating component is disposed opposite to the tall flat portion.

Furthermore, as other conventional one, according to "MOUNTING STRUCTURE OF ELECTRONIC BOARD" disclosed in the following Patent Document 3, the concept of a thermal via and an isolated projection is shown. The thermal via serves as a heat transferring through hole which is for transferring and dissipating the generated heat of a heating component mounted on one surface of a circuit board to a heat transfer base provided on the other surface of the circuit board, and the isolated projection constitutes a small gap which is for filling a heat transfer material.

Further, as other conventional one, according to "ELECTRONIC BOARD DEVICE" disclosed in the following Patent Document 4, the concept of a portion passing through aboard (hereinafter, referred to as a "board pass through portion") and an isolated projection is shown. The board pass through portion is for transferring and dissipating the generated heat of a heating component mounted on one surface of a circuit board to a central projection portion of a heat transfer base provided on the other surface of the circuit board, and the isolated projection constitutes a small gap which is for filling a heat transfer material. Incidentally, in the case of Patent Document 4, the configuration thereof is such that the generated heat of the heating component is transferred by coming into contact with both sides of the base side and the cover side via heat transfer materials, the cover is formed in an uneven shape of a tall flat portion and a short flat portion, and the heating component is disposed opposite to the short flat portion.

RELATED ART DOCUMENT

Patent Document

[Patent Document 1] Japanese Patent Gazette No. 4091568 (FIG. 1, Paragraph No. [0006])
[Patent Document 2] Japanese Unexamined Patent Publication No. 2007-184428 (FIG. 1, FIG. 2, Paragraph No. [0030])
[Patent Document 3] Japanese Unexamined Patent Publication No. 2009-124023 (FIG. 3, Abstract of the Disclosure)
[Patent Document 4] Japanese Unexamined Patent Publication No. 2010-123787 (FIG. 3, Abstract of the Disclosure, FIG. 6, Paragraph No. [0040])

Problems to be Solved by the Invention

In the aforementioned conventional Patent Document 1 "ELECTRONIC CONTROL DEVICE FOR ENGINE CONTROL," the generated heat of the major heating component is transferred and dissipated to only the cover (referred to as the "base" in the present application) and heat radiation to the case (referred to as the "cover" in the present application) side is not taken into consideration. Therefore, a problem exists in that sufficient heat dissipation cannot be performed in the case where the cover (base) side is in high temperature circumstances and the case (cover) side is in low temperature circumstances.

Furthermore, a drawback exists in that the major heating component is generally larger than other small heating component and therefore the thickness dimension of the cover (base) side increases; and problems exist in that if there are variations in the height dimension of the heating component, the thickness dimension of the heat transfer material fluctuates, heat transfer characteristics change considerably, and stress on a solder connection terminal is generated.

Further, the height dimension of the case (cover) is regulated by the height dimension of an external connection connector and the dimension between the small heating component and the inner surface of the case (cover) increases; and therefore, a problem exists that heat radiation characteristics deteriorate.

In the case of the "ELECTRONIC DEVICE" of the aforementioned Patent Document 2, the heating component is mounted on the circuit board surface that is disposed opposite to the case (referred to as the "cover" in the present application) and passes through the circuit board to perform heat transfer and heat dissipation to the base side. Therefore, the thickness dimension of the base side does not increase, heat transfer characteristics do not change even when there are variations in the height dimension of the heating component, and stress on a solder connection terminal is not generated. However, heat radiation to the case (cover) side is not taken into consideration; and therefore, a problem exists in that a temperature rise of the heating component cannot be sufficiently suppressed in the case where circumstances of the base side are higher in temperature than circumstances of the case (cover) side.

Furthermore, the case of the "MOUNTING STRUCTURE OF ELECTRONIC BOARD" of the aforementioned Patent Document 3 is also similar, and heat transfer and heat dissipation to the base are performed; however, heat dissipation by heat radiation to the cover is not taken into consideration. Therefore, a problem exists in that a temperature rise of the heating component cannot be sufficiently suppressed in the case where circumstances of the base side are higher in temperature than circumstances of the cover side.

Further, in the case of the "ELECTRONIC BOARD DEVICE" of the aforementioned Patent Document 4, the generated heat of the heating component is transferred and dissipated to both sides of the base side and the cover side. If there are variations in the height dimension of the heating component, the thickness dimension of the heat transfer material fluctuates; and accordingly, a drawback exists that heat transfer characteristics change considerably and stress on a solder connection terminal is generated.

SUMMARY OF THE INVENTION

The present invention has been made to solve the problem described above, and an object of the present invention is to provide a board housing case for a vehicle-mounted electronic device in which heat dissipation by heat transfer and heat dissipation by radiation to a major heating component are used together to obtain good heat dissipation characteristics.

Means for Solving the Problems

According to the present invention, there is provided a board housing case for a vehicle-mounted electronic device, the board housing case being for housing a circuit board which is mounted with a heating component and an external connection connector on a first board surface thereof, the circuit board being hermetically-sealed and held in sandwiched relation in a case that is composed of a metal base and a metal cover, and the circuit board making the end surface of a resin connector housing expose on the side of the case; the base has a material thickness that is a thickness dimension equal to or more than the material thickness of the cover, the base is provided with mounting legs for the purpose of being fixed and installed to a surface to be mounted, and the base is disposed opposite to the second board surface of the circuit board; the cover has a tall flat portion which is disposed opposite to the first board surface of the circuit board and is disposed opposite to the connector housing, and a short flat portion which is disposed opposite to the heating component; the cover and the base have outline peripheral portions coming into contact with each other via sealant, and partial peripheral portions coming into contact with a peripheral portion of the connector housing via the sealant; the heating component is thermally coupled with respect to a heat transfer base portion of the base via a heat transfer mechanism and a small gap portion in which a heat transfer filling material is filled, and the heating component has a coefficient of heat radiation that is 0.7 to 1.0; and the short flat portion, which is the inner surface of the cover and is disposed opposite to at least the heating component with a gap therebetween, is surface-finished to provide a coefficient of heat radiation of 0.7 to 1.0.

Advantageous Effect of the Invention

According to the board housing case for the vehicle-mounted electronic device of the present invention, the circuit board is held in sandwiched relation by the metal base and the metal cover; heat transfer and heat dissipation to the metal base and radiation and heat dissipation to the metal cover are used together for the heating component in which power consumption is large; and as for the radiation and heat dissipation to the cover, a gap dimension is reduced at the short flat portion of the cover and surface-finishing that makes the coefficient of heat radiation increase mutually is applied. Accordingly, even when there is a difference in temperature circumstances at the outer surface of the cover or the outer surface of the base, an effect exists that averaged and stable heat dissipation can be performed.

The foregoing and other objects, features, aspects and advantages of the present invention will become more apparent from the following detailed description of the present invention when taken in conjunction with the accompanying drawings.

DETAILED DESCRIPTION OF THE INVENTION

Mode for Carrying out the Invention

Embodiment 1

Figure 1:
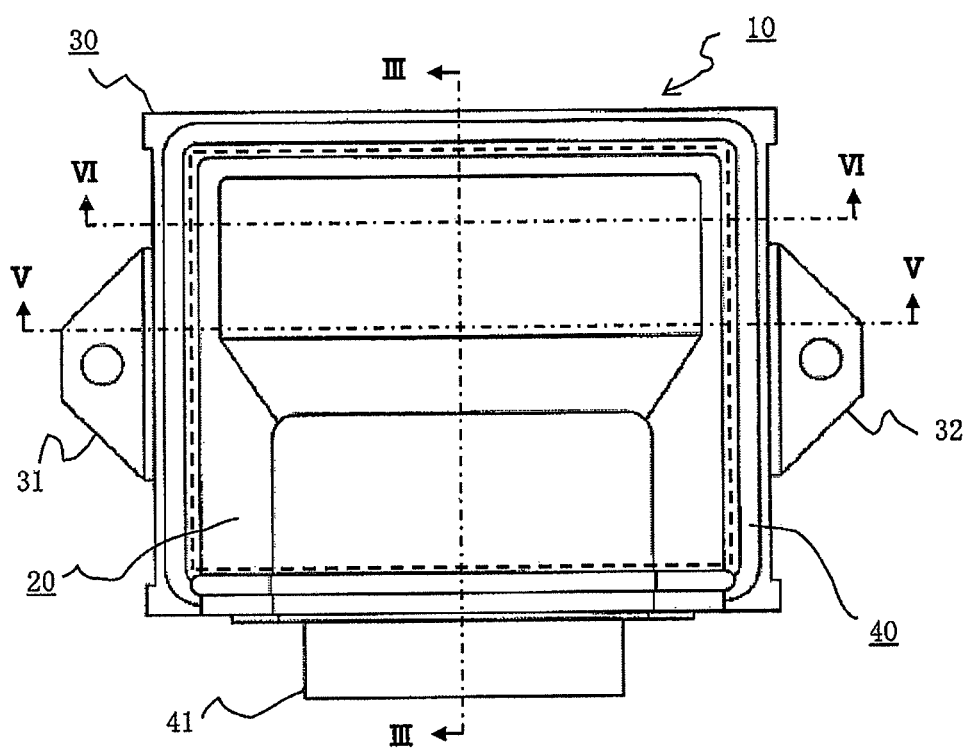
FIG. 1 is a plan view showing a board housing case for a vehicle-mounted electronic device according to Embodiment 1 of the present invention.

Hereinafter, detail description will be made in order with reference to the following drawings: FIG. 1 that is a plan view of a board housing case for a vehicle-mounted electronic device according to Embodiment 1 of the present invention, FIG. 2 that is a right side view of one shown in FIG. 1, FIG. 3 that is a cross-sectional view according to the line of one shown in FIG. 1, FIG. 4 that is a lower side view of one shown in FIG. 1, FIG. 5 that is a cross-sectional view according to the line V-V of one shown in FIG. 1, FIG. 6 that is a cross-sectional view according to the line VI-VI of one shown in FIG. 1, and FIG. 7 that is a single item outline view of a cover of one shown in FIG. 1. However, in the respective drawings, identical or equivalent members and portions will be described with the same reference numerals assigned thereto.

Figure 2:
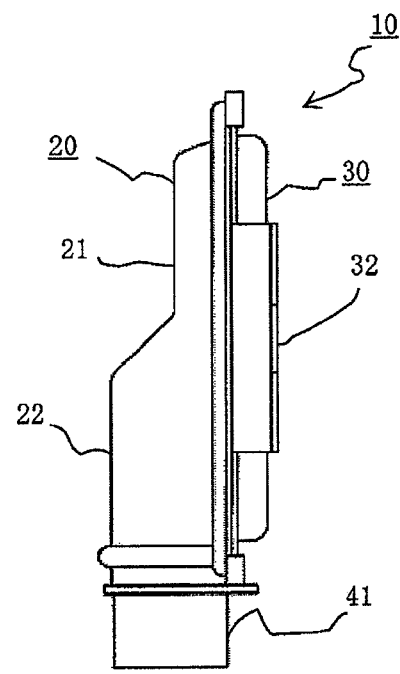
FIG. 2 is a right side view of FIG. 1.

In FIG. 1 and FIG. 2, a board housing case 10 is mainly composed of a metal cover 20 and a metal base 30; and a circuit board 40 shown by a dotted line is held in sandwiched relation by the cover 20 and the base 30 to be hermetically-sealed and housed in the case.

The base 30 is to be installed and fixed on a surface to be mounted (not shown in the drawing) via mounting legs 31, 32 disposed on the right and the left; and the material thickness of the base 30 is a thickness dimension that is not less than the material thickness of the cover 20 in order to support case weight.

Furthermore, an external connection connector 42 (to be described later in FIG. 3) is soldered to the circuit board 40; and the end surface of a resin connector housing 41 to which a plurality of the external connection connectors 42 are press-fitted and fixed is exposed to the side of the case (the underside shown in FIG. 1).

Incidentally, the cover 20 is composed of a tall flat portion 22 that is disposed opposite to the connector housing 41 and a short flat portion 21 that is disposed opposite to a heating component 43a (to be described later in FIG. 3).

Figure 3:
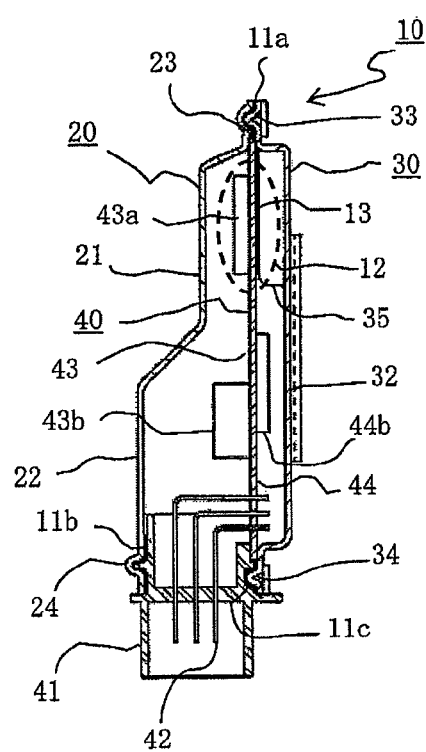
FIG. 3 is a cross-sectional view taken along the line III-III shown in FIG. 1.

In FIG. 3, the cover 20 and the base 30 include three side outline peripheral portions 23, 33 which come into contact with each other via waterproof sealant 11a and partial peripheral portions 24, 34 which come into contact with the periphery of the connector housing 41 via sealant 11b, 11c; and the circuit board 40 is held in sandwiched relation by the three side outline peripheral portions 23, 33.

One end of the external connection connector 42 is soldered and connected to the first board surface 43 of the circuit board 40; the heating component 43a having large power consumption and a first small heating component 43b having relatively small power consumption are mounted on the first board surface 43; and the first board surface 43 is disposed opposite to the inner surface of the cover 20.

In the inner surface of the cover 20, a partial region of the short flat portion 21 that is disposed opposite to at least the heating component 43a is surface-finished to provide a coefficient of heat radiation of not less than 0.7.

Figure 6:
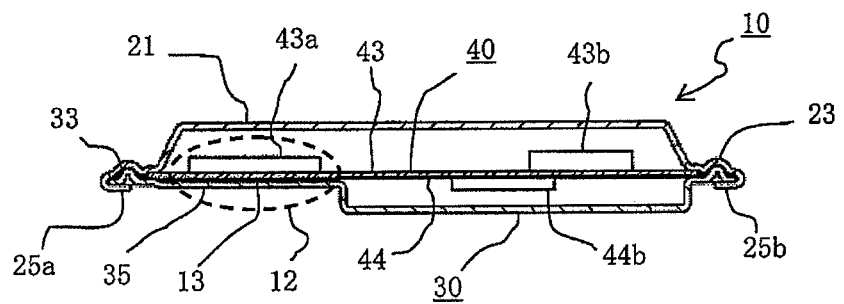
FIG. 6 is a cross-sectional view taken along the line VI-VI shown in FIG. 1.

A second small heating component 44b in which power consumption is relatively small is mounted on the second board surface 44 of the circuit board 40; and the second board surface 44 is disposed opposite to the inner surface of the base 30. The inner surface of the base 30 is coated with thermally conductive dark paint and a heat transfer base portion 35 is formed at a partial region of the base 30; and as shown in FIG. 6, the heat generated from the heating component 43a is transferred to the heat transfer base portion 35 via a heat transfer mechanism 12 and a heat transfer filling material 13. Incidentally, detail of the heat transfer mechanism 12 will be described later with reference to FIG. 10 to FIG. 13, or FIG. 14.

Figure 4:
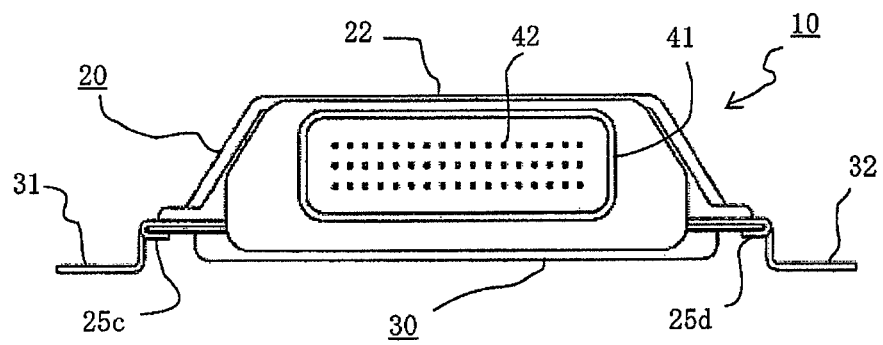
FIG. 4 is a front view of FIG. 1.
Figure 5:
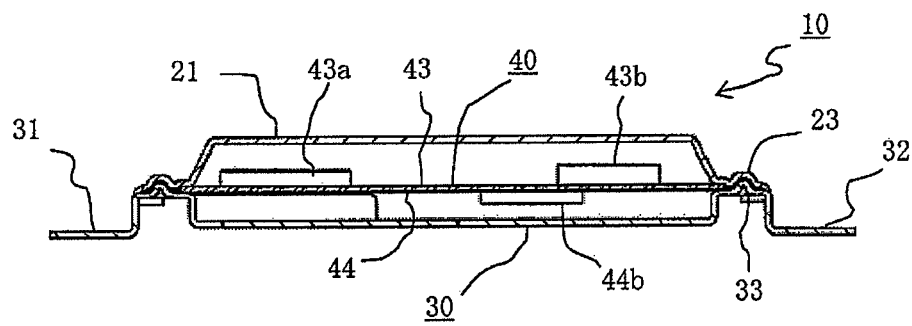
FIG. 5 is a cross-sectional view taken along the line V-V shown in FIG. 1.

In FIG. 4 and FIG. 5, the cover 20 includes folded pieces 25a to 25d (25c is not shown in the drawing) at four corners as to be described later in FIG. 7. As shown in FIG. 4, the folded pieces 25a to 25d (25a and 25b are not shown in the drawing) are folded; and accordingly, the cover 20 and the base 30 are integrated.

Furthermore, the three side outline peripheral portions 23, 33 of the cover 20 and the base 30 and the partial peripheral portions 24, 34 are formed in a convex and concave surface where the waterproof sealant 11a, 11b, 11c are coated as shown in FIG. 5 and FIG. 3.

In FIG. 6, the heat transfer base portion 35 provided on the base 30 is located at an upper left corner portion shown in FIG. 1; and the generated heat of the heating component 43a is transferred to the heat transfer base portion 35 via the heat transfer mechanism 12 and the heat transfer filling material 13 (to be described later) and the generated heat is diffused to the whole of the base 30 to perform heat dissipation.

Further, the generated heat of the heating component 43a is transferred from the heat transfer base portion 35 to the cover 20 via the sealant 11a and is diffused to the whole of the cover 20 to perform heat dissipation.

Figure 7:
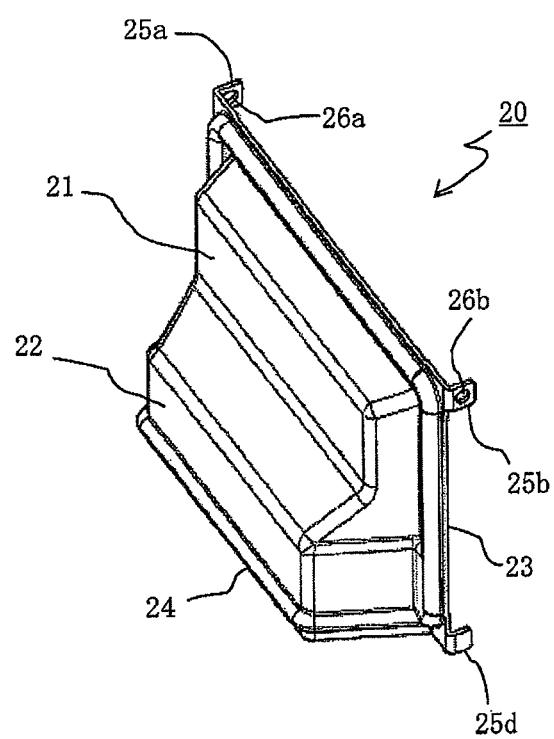
FIG. 7 is a single item outline view of a cover shown in FIG. 1.

In FIG. 7, among the folded pieces 25a to 25d (25c is not shown in the drawing) provided at four corners of the cover 20, the folded pieces 25c, 25d are shown in FIG. 4 and the folded pieces 25a, 25b are shown in FIG. 6.

Among the folded pieces 25a to 25d, the folded pieces 25a, 25b are formed with an unloaded hole 26a, 26b; and when the whole of the inner surface or the whole of the inner and outer surfaces of the cover 20 is electrostatically coated with dark base paint, carrying suspenders (not shown in the drawing) are passed through the unloaded holes 26a, 26b and accordingly the cover 20 can be carried in a stable posture.

Incidentally, it is possible to form unloaded holes 26c, 26d in place of the unloaded holes 26a, 26b; however, in order not to suspend in a wrong direction, the unloaded holes are formed so as to be limited to two points.

In addition, a gap dimension between the inner surface of the tall flat portion 22 of the cover 20 and the first board surface 43 of the circuit board 40 and a gap dimension between the inner surface of the short flat portion 21 and the first board surface 43 are formed with a difference in height of 1.5 to 2.5 times, and the surfaces having the difference in height are connected by a steep gradient having a tilt angle of not less than 45 degrees.

Therefore, a tall component is shifted to the tall flat portion 22 so that the gap between the heating component 43a and the short flat portion 21 is shortened and a surface area of the cover 20 is increased to improve heat dissipation properties.

Hereinafter, operation and effect of the board housing case 10 of the vehicle-mounted electronic device according to Embodiment 1 of the present invention will be described in detail with reference to FIG. 8 that is a characteristic diagram of temperature rises and FIG. 9 that is a view showing a list of measurement parameters for those shown in FIG. 8.

Figures 8, 9:
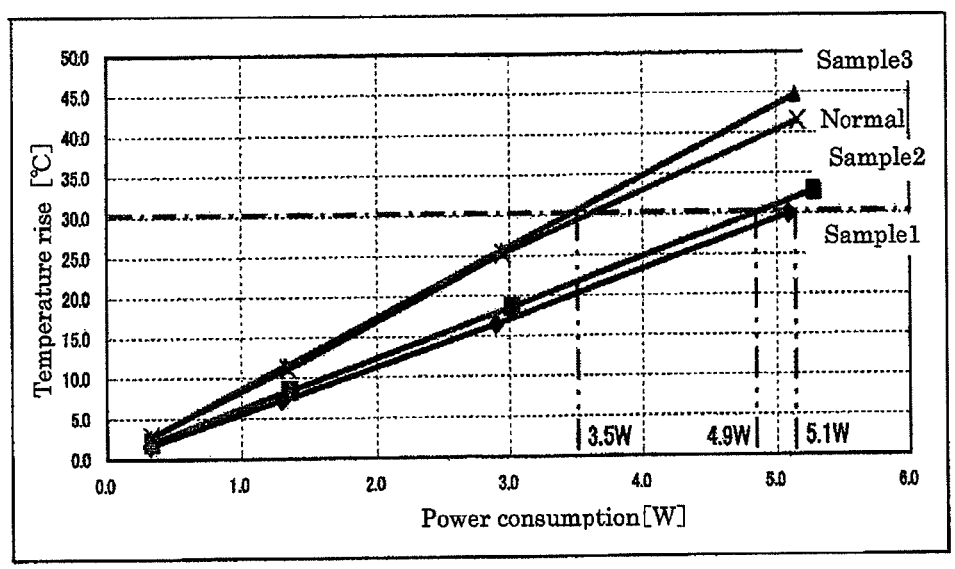
FIG. 8 is a characteristic diagram showing characteristics of temperature rises for one shown in FIG. 1.
FIG. 9 is a view showing a list of measurement parameters for those shown in FIG. 8.

In FIG. 8, the relationship between a temperature rise value shown by a longitudinal axis and power consumption shown by a lateral axis represents the relationship between power consumption corresponding to an applied power supply voltage and a maximum temperature rise value of outer surface temperature of the heating component. The applied power supply voltage is a variable power supply voltage applied to a power circuit and a control circuit component (not shown in the drawing) mounted on the circuit board 40 under a predetermined circumstance temperature and the case where the board housing case 10 in which the circuit board 40 is housed is installed and fixed at a predetermined installation location.

Among four characteristic diagrams shown in FIG. 8, different points for those described as normal and samples 1 to 3 depend on a difference in parameters shown in FIG. 9.

In FIG. 9, one described as normal represents the case where the cover 20 made of aluminum and the base 30 made of aluminum are used and the surfaces of the cover 20 and the base 30 are retained in aluminum basis material which is not coated in dark; and in this case, the power consumption is a value of 3.7 W at which the temperature rise value is an allowable temperature rise value of 30° C.

Incidentally, the surface of the heating component 43a is black and its flat surface dimensions are 15×20 mm; whereas, the clearance gap between the inner surface of the short flat portion 21 of the cover 20 and the surface of the heating component 43a is 10 mm.

Furthermore, the dimension of a small gap portion G1 to be filled with the heat transfer filling material 13 is 0.5 mm.

In one described as sample 1, the inner and outer surfaces of the cover 20 are coated in non-heat transferable black as compared to a normal product, and the coefficient of heat radiation in this experiment is 0.8.

In this case, the power consumption is a value of 5.1 W at which the temperature rise value is the allowable temperature rise value of 30° C., and an improved effect of 138% is obtained as compared to the normal product.

In one described as sample 2, the inner and outer surfaces of the cover 20 and the base 30 are coated in non-heat transferable dark as compared to the normal product, and both coefficients of heat radiation are 0.8.

In this case, the power consumption is a value of 4.9 W at which the temperature rise value is the allowable temperature rise value of 30° C., and an improved effect of 132% is obtained as compared to the normal product.

In this regard, however, the improved effect deteriorates to 96% as compared to that of the sample 1; and this is because heat transfer resistance increases by the non-heat transferable dark coating when heat transfer is performed to the base 30 by the heat transfer mechanism 12.

In one described as sample 3, the inner surface of the base 30 is coated in non-heat transferable dark as compared to the normal product, and the coefficient of heat radiation in this experiment is 0.8.

In this case, the power consumption is a value of 3.5 W at which the temperature rise value is the allowable temperature rise value of 30° C., and the improved effect deteriorates to 94% as compared to that of the normal product.

This is because heat transfer resistance increases by the non-heat transferable dark coating when heat transfer is performed to the base 30 by the heat transfer mechanism 12.

Incidentally, the coating color of the outer surfaces of the cover 20 and the base 30 is preferably luster white in the case where a high temperature heating source is present near the outer surfaces; however, in the case of installation circumstances where heat dissipation is performed from the outer surfaces of the cover 20 and the base 30, it is advantageous to coat the outer surfaces in dark as in the inner surfaces. The coefficient of heat radiation of the surface by the dark coating is preferably near 1.0; however, when availability on the market and actual effect are taken into account, it is appropriate that the coefficient of heat radiation is in the range of 0.7 to 1.0.

Furthermore, thermally conductive dark paint including metal oxide or ceramic-based heat transfer filler is used for the inner surface of the base 30; and accordingly, when heat transfer is performed to the base 30 by the heat transfer mechanism 12, heat transfer resistance does not increase, heat dissipation by heat transfer and heat dissipation by radiation are used together, and more excellent improved characteristics than the sample 1 can be obtained.

Further, the sealant 11a to be coated between the outline peripheral portion 23 of the cover 20 and the outline peripheral portion 33 of the base 30 uses silicone resin material including heat transfer filler as in the heat transfer filling material 13 filled and coated between the heat transfer mechanism 12 and the heat transfer base portion 35; and accordingly, the generated heat of the heating component 43a is diffused not only from the heat transfer base portion 35 to the base 30, but also diffused to the cover 20 via the sealant 11a. Thus, heat dissipation characteristics are improved.

In this case, in the case where the inner surfaces of the outline peripheral portions 23, 33 are not coated or are coated, it is effective to use thermally conductive dark paint.

In the aforementioned description, at least the inner surface of the cover 20 is fully coated; however, in the case where the number of the first small heating components 43b provided on the first board surface 43 is small and the first small heating components 43b do not cause heat generation, a part of the inner surface of the cover 20 may be coated in dark.

The coated area in this case is preferably set to be not less than 15×20 mm that is the surface area of the heating component 43a and not more than dimensions of (10+15+10)× (10+20+10)=35×40 mm in consideration of a gap dimension of 10 mm that is the dimension between the inner surface of the cover 20 and the heating component 43a.

The aforementioned description describes the cover 20 and the base 30 that are processed by sheet metal working of aluminum plate material; however, at least one or both can be produced by aluminum die casting process.

Furthermore, it is possible that the folded pieces 25a to 25d provided at four corners of the cover 20 are eliminated, threaded holes are provided at four corners of the cover 20 or the base 30, an unloaded hole is formed at each of the four corners of the base 30 or the cover 20 on the opposite side, and both are screw-tightened and fixed by four screws.

Incidentally, the heating component 43a is generally a thin and flat structure in order to enhance heat radiation properties; however, in the case where there is a special heating component which is also a tall component and relatively large in power consumption in addition to this sort of the heating component 43a, the special heating component is located under the tall flat portion 22, heat transfer and dissipation to the base 30 are performed via the heat transfer mechanism 12 and the heat transfer filling material 13 as in the case of the heating component 43a, and the inner surface of the tall flat portion 22 is coated with dark paint; and accordingly, heat radiation characteristics can be improved.

As is apparent from the aforementioned description, according to Embodiment 1 of the present invention, there is provided the board housing case 10 for the vehicle-mounted electronic device, the board housing case 10 being for the circuit board 40 which is mounted with the heating component 43a and the external connection connector 42 on the first board surface 43 thereof, the circuit board 40 being hermetically-sealed and held in sandwiched relation in the case that is composed of the metal base 30 and the metal cover 20, and the circuit board 40 making end surface of the resin connector housing 41 expose on the side of the case. The base 30 has a material thickness that is a thickness dimension equal to or more than the material thickness of the cover 20, the base 30 is provided with the mounting legs 31, 32 for the purpose of being fixed and installed to a surface to be mounted, the base 30 is fixed and installed to the surface to be mounted via the mounting legs 31, 32, and the base 30 is disposed opposite to the second board surface 44 of the circuit board 40; the cover 20 has the tall flat portion 22 which is disposed opposite to the first board surface 43 of the circuit board 40 and is disposed opposite to the connector housing 41, and the short flat portion 21 which is disposed opposite to the heating component 43a; the cover 20 and the base 30 have the outline peripheral portions 23, 33 coming into contact with each other via the waterproof sealant 11a, and the partial peripheral portions 24, 34 coming into contact with the peripheral portion of the connector housing 41 via the sealant 11b, 11c; the heating component 43a is thermally coupled with respect to the heat transfer base portion 35 of the base 30 via the heat transfer mechanism 12 and the small gap portion G1 in which the heat transfer filling material 13 is filled, and quality of material or color tone of exterior material of the heating component 43a has a coefficient of heat radiation of 0.7 to 1.0; and the short flat portion 21, which is the inner surface of the cover 20 and is disposed opposite to at least the heating component 43a with a gap therebetween, is surface-finished to provide a coefficient of heat radiation of 0.7 to 1.0.

The gap dimension between the inner surface of the tall flat portion 22 of the cover 20 and the first board surface 43 of the circuit board 40 and the gap dimension between the inner surface of the short flat portion 21 and the first board surface 43 are formed with the difference in height of 1.5 to 2.5 times, and the surfaces having the difference in height are connected by the steep gradient having the tilt angle of not less than 45 degrees.

As described above, with reference to Claim 2 of the present invention, not less than the predetermined difference in height exists between the tall flat portion 22 and the short flat portion 21 of the cover 20, and the tall flat portion 22 and the short flat portion 21 are connected by not less than the predetermined steep gradient.

Therefore, the above configuration is characterized in that the tall component is shifted to the tall flat portion 22 so that the gap between the heating component 43a and the short flat portion 21 can be shortened and the surface area of the cover 20 is increased to be able to improve heat dissipation properties.

The surface finishing to be applied to the interior surface of the cover 20 is one in which a dark base sheet is stuck or dark base paint is sprayed, stamp-coated, or brush-coated; and a region of the surface finishing has an area in which a flat region opposite to the heating component 43a is defined as the lower limit and a flat region in which a gap dimension to the heating component 43a is extended in four directions with respect to the lower limit region is defined as the upper limit.

As described above, with reference to Claim 3 of the present invention, the region of the surface finishing to be applied to the interior surface of the cover 20 is such that the surface opposite to the heating component is defined as the lower limit and the extended opposite surface added by the gap dimension is defined as the upper limit.

Therefore, the above configuration is characterized in that the generated heat of the heating component 43a can be efficiently dissipated to the cover 20 while suppressing the amount to be used for the paint or the sticking sheet, and the surface finishing can be performed by simple processing equipment.

The first board surface 43 of the circuit board 40 is mounted with a plurality of the first small heating components 43b serving as low-capacity heating components each disposed opposite to the inner surface of the cover 20 with a gap therebetween; the surface finishing to be applied to the interior surface of the cover 20 is fully coated with dark paint to at least the inner surface of the cover 20; and the cover 20 is provided with the folded pieces 25a to 25d to be caulked and fixed to the base 30 at four corners thereof, and some of the folded pieces 25a to 25d are formed with the unloaded hole 26a, 26b to which a carrying suspender is inserted when the cover 20 is fully coated.

As described above, with reference to Claim 5 of the present invention, the inner surface of the cover 20 is fully coated with dark paint, some of the folded pieces 25a to 25d for caulking and fixing the cover 20 and the base 30 are formed with the unloaded hole 26a, 26b to which the carrying suspender is inserted.

Therefore, the above configuration is characterized in that when a plurality of scattered small heating components 43b, 44b are mounted on the circuit board 40, the surface finishing to the inner surface of the cover 20 is easy and the cover 20 is fully coated in a stable posture.

The second board surface 44 of the circuit board 40 is mounted with a plurality of the second small heating components 44b serving as low-capacity heating components each disposed opposite to the inner surface of the base 30 with a gap therebetween, and the whole of the inner surface of the base 30 is coated with thermally conductive dark paint including metal oxide or ceramic-based heat transfer filler to provide a coefficient of heat radiation of 0.7 to 1.0.

As described above, according to Claim 6 of the present invention, the whole of the inner surface of the base 30 is coated with, for example, high thermally conductive dark paint that is ceramic based paint.

Therefore, the above configuration is characterized in that thermal conductivity of the heating component, which has large power consumption and is heat transferred to the inner surface of the base 30 via the heat transfer mechanism 12 and the heat transfer filling material 13, is not blocked by the paint coated to the inner surface of the base 30; and the generated heat of the second small heating component 44b mounted on the second board surface 44 of the circuit board 40 can be efficiently dissipated to the inner surface of the base 30.0.

The heat transfer base portion 35 is located at a position just proximal to the outline peripheral portion 33 of the base 30; the sealant 11a to be filled in surfaces coming into contact with the outline peripheral portions 23, 33 of the cover 20 and the base 30 is the same material as the heat transfer filling material 13 to be filled between the heating component 43a and the heat transfer base portion 35 and the sealant 11a is silicone resin including heat transfer filler that is electrically nonconductive; and the inner surfaces of the outline peripheral portions 23, 33 of the cover 20 and the base 30 are not coated or are coated with thermally conductive dark paint.

As described above, according to Claim 7 of the present invention, the heat transfer base portion 35 of the heating component 43 is provided on the outline peripheral portion 33 of the base 30; and the outline peripheral portions 23, 33 of the base 30 and the cover 20 are waterproofed by the heat transferable sealant 11a, 11b, 11c.

Therefore, the above configuration is characterized in that the generated heat of the heating component 43a is transferred by coming into contact with both base 30 and cover 20 and heat dissipation characteristics are improved.

Embodiment 2

Hereinafter, description will be made on FIGS. 10, 11 which are cross-sectional views and FIGS. 12, 13 which are plan views, each showing a heat transfer mechanism 12A of a board housing case for a vehicle-mounted electronic device according to Embodiment 2 of the present invention.

Figure 10:
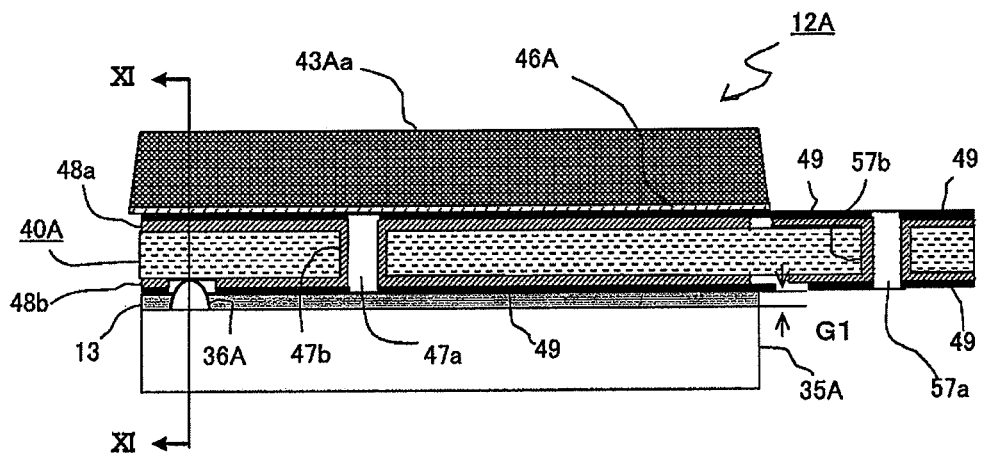
FIG. 10 is a cross-sectional view showing a heat transfer mechanism in a board housing case for a vehicle-mounted electronic device according to Embodiment 2 of the present invention.
Figure 11:
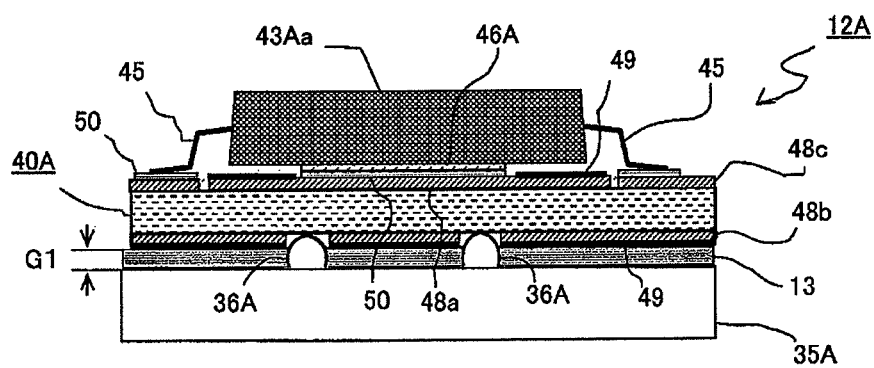
FIG. 11 is a cross-sectional view taken along the line XI-XI shown in FIG. 10.

Incidentally, FIG. 11 is the cross-sectional view taken along the line XI-XI shown in FIG. 10, and the same reference numerals as those in each drawing represent the same or corresponding elements.

Furthermore, Embodiment 2 represents detail of the heat transfer mechanism 12 of Embodiment 1, descriptions of other reference numerals are directly incorporated into this embodiment or identified by a reference letter A assigned thereto.

In FIGS. 10, 11, an electronic board 40A is disposed on a heat transfer base portion 35A having a plurality of isolated projection portions 36A, 36A with a small gap portion G1 defined by the height dimension of the isolated projection portion 36A; and on the opposite surface of the electronic board 40A, a heating component 43Aa having a heat dissipating electrode 46A and surface connection electrodes 45 is provided.

A plurality of the surface connection electrodes 45 arranged on the right and the left of the heating component 43Aa are mounted on a plurality of wiring patterns 48c respectively via solder paste 50, the wiring patterns 48c being provided on a first board surface 43 of the circuit board 40A.

The heat dissipating electrode 46A of the heating component 43Aa is mounted on a first heat transfer pattern 48a via the solder paste 50, the first heat transfer pattern 48a being provided on the first board surface 43 of the circuit board 40A. In this regard, however, FIG. 11 shows a state before the solder paste 50 is heated and melted; and actually, the circuit board 40A is mounted on the inner surface of the base 30 after soldering by heating and melting.

A second heat transfer pattern 48b is provided on a second board surface 44 of the circuit board 40A, and the first heat transfer pattern 48a and the second heat transfer pattern 48b are connected by a plated layer 47b (to be described later in FIG. 10). Incidentally, a blank window 52 (to be described later in FIG. 13) is provided in the second heat transfer pattern 48b and the isolated projection portion 36A comes into contact with the blank window 52.

A solder resist film 49 is print-coated on the first board surface 43 and the second board surface 44 of the circuit board 40A except for portions where the solder paste 50 is applied and soldered; and accordingly, excess solder is prevented from flowing out and copper foil patterns are prevented from oxidation and corrosion.

A heat transfer filling material 13, which is silicone resin that is electrically nonconductive and includes, for example, metal oxide or ceramics-based heat transferable filler, is filled and coated between the circuit board 40A and the heat transfer base portion 35A, the circuit board 40A being disposed opposite to the heat transfer base portion 35A with a small gap dimension of, for example, 0.5 mm by the isolated projection portion 36A.

Incidentally, in the case where the solder resist film 49 is non-thermal conductivity, the solder resist film 49 is not provided at a portion opposite to the heat transfer base portion 35A; and the second heat transfer pattern 48b directly comes into contact with the heat transfer base portion 35A via the heat transfer filling material 13.

In FIG. 10, a heat transferring through hole 47a passing through the circuit board 40A is provided between the first heat transfer pattern 48a and the second heat transfer pattern 48b; and a plated layer 47b is formed on the inner circumferential surface of the heat transferring through hole 47a.

Incidentally, as to be described later in FIG. 12 and FIG. 13, the heat transferring through holes 47a are provided in plural numbers for the purpose of heat-transferring between the first heat transfer pattern 48a and the second heat transfer pattern 48b; and actually, the heat transferring through holes 47a are also electrically conductive.

Furthermore, in order to perform interlayer connection of various circuit patterns, a large number of via holes 57a are formed in the circuit board 40A; and such circuit patterns are electrically connected by plated layers 57b each provided on the inner circumference of the via hole 57a.

The solder resist film 49 is not provided on some or the whole of these via holes 57a; and accordingly, air-permeable properties between the front and back surfaces of the circuit board 40A are secured and a hermetic space on the cover 20 side and a hermetic space on the base 30 side are communicated so as not to generate a considerable temperature difference.

The solder resist film 49 is formed on substantially the whole surface of the circuit board 40A; and therefore, it is significant to enhance the coefficient of heat radiation thereof. More particularly, the solder resist film 49 is also coated at a portion where a copper foil pattern is removed by etching and a resin base material is exposed; and therefore, if thermal conductivity and the coefficient of heat radiation of the solder resist film 49 are high, the coefficient of heat radiation to the inner surfaces of the cover 20 and the base 30 can be enhanced.

The thermal conductivity and the coefficient of heat radiation of the solder resist film 49 are preferably high values as much as possible; however, from a balanced view of availability on the market and temperature rise suppression effect, it is appropriate to select one which is a dark base solder resist material including metal oxide or ceramics-based heat transfer filler and has a coefficient of heat radiation of 0.6 to 1.0.

Figure 12:
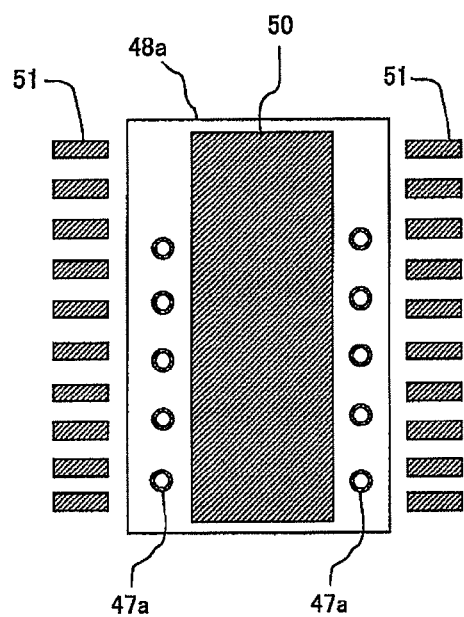
FIG. 12 is a plan view of the heat transfer mechanism shown in FIG. 10.

In FIG. 12, the first heat transfer pattern 48a is a copper foil pattern provided on the component mounting surface of the electronic board 40A and most part thereof is coated with the solder paste 50 at a position where the heat dissipating electrode 46A of the heating component 43A is soldered and connected.

Incidentally, a large number of the heat transferring through holes 47a are located within the first heat transfer pattern 48a and are provided at positions where the solder paste 50 is not coated; and these regions are coated with the solder resist film 49 shown in FIG. 10 and FIG. 11 or are not coated with.

Furthermore, the solder paste 50 is coated on signal electrode lands 51 to be connected to the wiring pattern 48c, and the surface connection electrodes 45 of the heating component 43Aa are soldered to the signal electrode lands 51.

Figure 13:
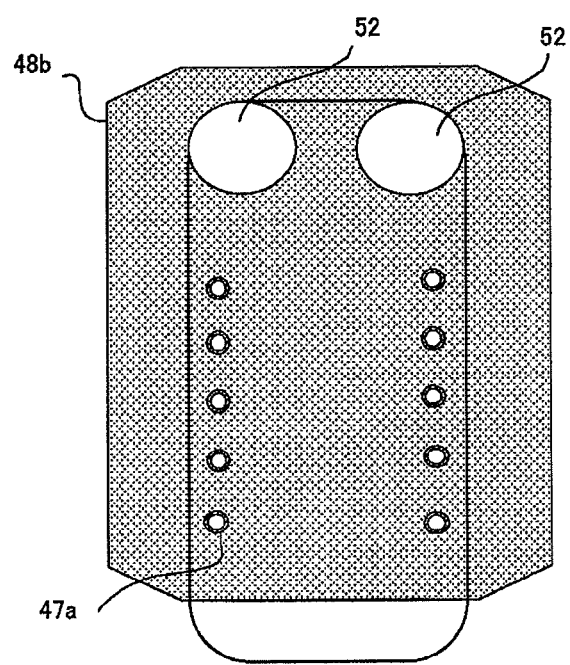
FIG. 13 is a plan view of the heat transfer mechanism shown in FIG. 10.

In FIG. 13, the second heat transfer pattern 48b is formed by the copper foil pattern of the circuit board 40A, and the second heat transfer pattern 48b is heat-transferred and connected to the first heat transfer pattern 48a of the opposite surface by a large number of the heat transferring through holes 47a.

A plurality of blank windows 52, 52 are located at positions which correspond to the positions with which the isolated projection portions 36A, 36A come into contact and the copper foil pattern is cut off and the resin base material is exposed. In this regard, however, it may be configured such that the solder resist film 49 having thermal conductivity is provided on the whole surface of the second heat transfer pattern 48b including the blank windows 52 and the isolated projection portions 36A, 36A come into contact with the resin base material via the solder resist film 49.

As is apparent from the aforementioned description, according to Embodiment 2 of the present invention, there is provided the board housing case 10 for the vehicle-mounted electronic device, the board housing case 10 being for the circuit board 40A which is mounted with the heating component 43Aa and the external connection connector 42 on the first board surface 43 thereof, the circuit board 40A being hermetically-sealed and held in sandwiched relation in the case that is composed of the metal base 30 and the metal cover 20, and the circuit board 40A making the end surface of the resin connector housing 41 expose on the side of the case. The base 30 has a material thickness that is a thickness dimension equal to or more than the material thickness of the cover, the base 30 is provided with the mounting legs 31, 32 for the purpose of being fixed and installed to a surface to be mounted, the base 30 is fixed and installed to the surface to be mounted via the mounting legs 31, 32, and the base 30 is disposed opposite to the second board surface 44 of the circuit board 40A; the cover 20 has the tall flat portion 22 which is disposed opposite to the first board surface 43 of the circuit board 40A and is disposed opposite to the connector housing 41, and the short flat portion 21 which is disposed opposite to the heating component 43Aa; the cover 20 and the base 30 have the outline peripheral portions 23, 33 coming into contact with each other via the waterproof sealant 11a, and the partial peripheral portions 24, 34 coming into contact with the peripheral portion of the connector housing 41 via the sealant 11b, 11c; the heating component 43Aa is thermally coupled with respect to the heat transfer base portion 35A of the base 30 via the heat transfer mechanism 12A by the heat transferring through holes 47a passing through the circuit board 40A and the small gap portion G1 in which the heat transfer filling material 13 is filled, and quality of material or color tone of exterior material of the heating component 43Aa has a coefficient of heat radiation of 0.7 to 1.0; and the short flat portion 21, which is the inner surface of the cover 20 and is disposed opposite to at least the heating component 43Aa with a gap therebetween, is surface-finished to provide a coefficient of heat radiation of 0.7 to 1.0.

The heat transfer mechanism 12A is composed of a plurality of the heat transferring through holes 47a each having the plated layer 47b for thermally coupling the first heat transfer pattern 48a which is provided on the first board surface 43 and to which the heat dissipating electrode 46A of the heating component 43Aa is soldered and the second heat transfer pattern 48b which is provided on the second board surface 44; the heat transfer base portion 35A is formed with the isolated projection portion 36A for forming the small gap portion G1 in which the heat transfer filling material 13 is filled and coated; and the circuit board 40A is formed with the via holes 57a which communicate with the front and back surfaces thereof to connect interlayer patterns, and some of the via holes 57a and the front and back surfaces of the circuit board 40A except for solder connection portions are formed with the solder resist film 49 defined so that the coefficient of heat radiation is 0.6 to 1.0.

As described above, with reference to Claim 8 of the present invention, the heat transfer mechanism 12A is composed of the heat transferring through holes 47a which thermally connect the first heat transfer pattern 48a and the second heat transfer pattern 48b that are provided on the front and back surfaces of the circuit board 40A, the solder resist film 49 having high coefficient of heat radiation is formed on the circuit board 40A, and air-permeable properties between the front and back surfaces of the circuit board 40A are maintained by the via holes 57a.

Therefore, the above configuration is characterized in that direct heat transfer from the first board surface 43 to the second board surface 44 and heat radiation properties from the solder resist film 49 formed on substantially the whole surface of the circuit board 40A are improved; and a temperature difference between hermetic spaces of the front and back surfaces of the circuit board 40A is reduced and uniformized, and even when there is a difference in temperature circumstances at the outer surface of the cover 20 or the outer surface of the base 30, heat dissipation to either low temperature circumstance side is enhanced and averaged stable heat dissipation can be performed without depending on only either heat dissipation.

Embodiment 3

Figure 14:
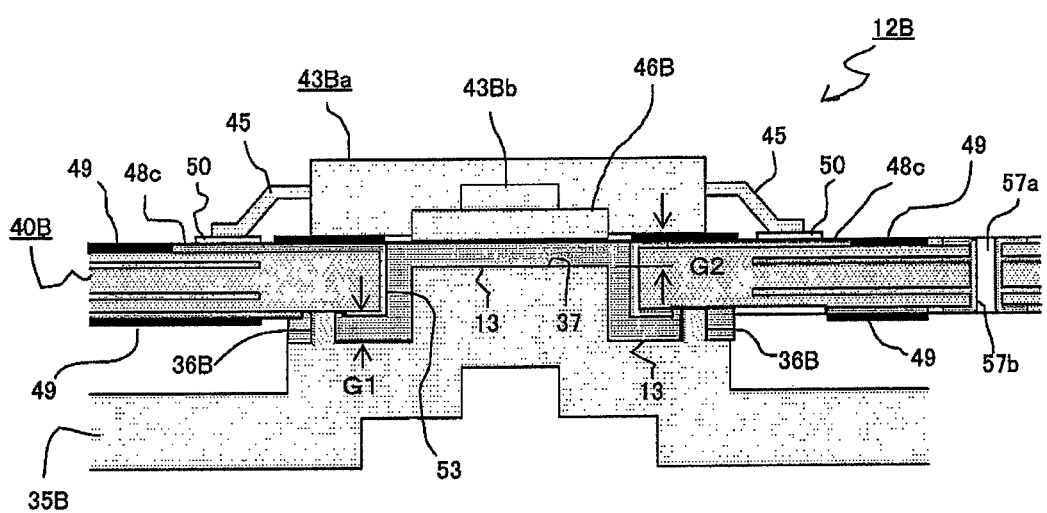
FIG. 14 is a cross-sectional view showing a heat transfer mechanism in a board housing case for a vehicle-mounted electronic device according to Embodiment 3 of the present invention.

Embodiment 3 of the present invention will be described with reference to FIG. 14. FIG. 14 is a cross-sectional view showing a heat transfer mechanism in a board housing case for a vehicle-mounted electronic device according to Embodiment 3 of the present invention. Incidentally, Embodiment 3 represents detail of the heat transfer mechanism 12 in the aforementioned Embodiment 1, descriptions of other reference numerals are directly incorporated into this embodiment or identified by a reference letter B assigned thereto.

In FIG. 14, a heating component 43Ba is attached to a first board surface 43 of a circuit board 40B; the heating component 43Ba is composed of a heating element 43Bb mounted on a die pad 46B serving as a heat transfer member and a plurality of surface connection electrodes 45, 45; and the surface connection electrodes 45, 45 are soldered and connected to wiring patterns 48c provided on the first board surface 43 of the circuit board 40B.

A board pass through portion 53 is formed in the circuit board 40B; and a central projection portion 37 integrally formed with a heat transfer base portion 35B inserts to the board pass through portion 53 and the end surface of the central projection portion 37 is disposed opposite to the die pad 46B incorporated in the heating component 43Ba with a small gap portion G2 therebetween.

Incidentally, the board pass through portion 53 in this embodiment shows a case example in which through hole plating that electrically connects front surface copper foil and back surface copper foil of the circuit board 40B is formed.

On the other hand, a plurality of isolated projection portions 36B, 36B each having a height of approximately 0.5 mm are integrally formed with the heat transfer base portion 35B and the projection portions 36B, 36B are butted to the back surface of the circuit board 40B; and accordingly, the small gap portion G2 is formed between the die pad 46B and the central projection portion 37 and a small gap portion G1 is formed between the opposite surfaces of the circuit board 40B and the heat transfer base portion 35B. A heat transfer filling material 13 is filled and coated in the small gap portions G1, G2.

Incidentally, butting surfaces of the isolated projection portions 36B, 36B and the circuit board 40B in this embodiment are insulation base materials in which copper foil patterns are removed as in the case of FIG. 13; however, insular lands separated from other wiring patterns can be served as the butting surfaces.

A plurality of the surface connection electrodes 45 arranged on the right and the left of the heating component 43Ba are mounted on a plurality of the wiring patterns 48c respectively via solder paste 50, the wiring patterns 48c being provided on the first board surface 43 of the circuit board 40B.

In this regard, however, FIG. 14 shows a state before the solder paste 50 is heated and melted; and actually, the circuit board 40B is mounted on the inner surface of a base 30 after soldering by heating and melting.

A solder resist film 49 is print-coated on the first board surface 43 and a second board surface 44 of the circuit board 40B except for portions where the solder paste 50 is applied and soldered; and accordingly, excess solder is prevented from flowing out and the copper foil patterns are prevented from oxidation and corrosion.

Furthermore, in order to perform interlayer connection of various circuit patterns, a large number of via holes 57a are formed in the circuit board 40B; and such circuit patterns are electrically connected by plated layers 57b each provided on the inner circumference of the via hole 57a.

The solder resist film 49 is not provided on some or the whole of these via holes 57a; and accordingly, air-permeable properties between the front and back surfaces of the circuit board 40B are secured and a hermetic space on the cover 20 side and a hermetic space on the base 30 side are communicated so as not to generate a considerable temperature difference.

The solder resist film 49 is formed on substantially the whole surface of the circuit board 40B; and therefore, it is significant to enhance the coefficient of thermal conductivity and the coefficient of heat radiation thereof as in the case of Embodiment 2.

As is apparent from the aforementioned description, according to Embodiment 3 of the present invention, there is provided the board housing case 10 for the vehicle-mounted electronic device, the board housing case 10 being for the circuit board 40B which is mounted with the heating component 43Ba and the external connection connector 42 on the first board surface 43 thereof, the circuit board 40B being hermetically-sealed and held in sandwiched relation in the case that is composed of the metal base 30 and the metal cover 20, and the circuit board 40B making the end surface of the resin connector housing 41 expose on the side of the case. The base 30 has a material thickness that is a thickness dimension equal to or more than the material thickness of the cover, the base 30 is provided with the mounting legs 31, 32 for the purpose of being fixed and installed to a surface to be mounted, the base 30 is fixed and installed to the surface to be mounted via the mounting legs 31, 32, and the base 30 is disposed opposite to the second board surface 44 of the circuit board 40B; the cover 20 has the tall flat portion 22 which is disposed opposite to the first board surface 43 of the circuit board 40B and is disposed opposite to the connector housing 41, and the short flat portion 21 which is disposed opposite to the heating component 43Ba; the cover 20 and the base 30 have the outline peripheral portions 23, 33 coming into contact with each other via the waterproof sealant 11a, and the partial peripheral portions 24, 34 coming into contact with the peripheral portion of the connector housing 41 via the sealant 11b, 11c; the heating component 43Ba is thermally coupled with respect to the heat transfer base portion 35B of the base 30 via the heat transfer mechanism 12B by the board pass through portion 53 passing through the circuit board 40B and small gap portions G1, G2 in which the heat transfer filling material 13 is filled, and quality of material or color tone of exterior material of the heating component 43Ba has a coefficient of heat radiation of 0.7 to 1.0; and the short flat portion 21, which is the inner surface of the cover 20 and is disposed opposite to at least the heating component 43Ba with a gap therebetween, is surface-finished to provide a coefficient of heat radiation of 0.7 to 1.0.

The heat transfer mechanism 12B is configured by the board pass through portion 53 to which the central projection portion 37 formed on the heat transfer base portion 35B is inserted and disposed opposite to the die pad 46B of the heating component 43Ba; the heat transfer base portion 35B is formed with the isolated projection portion 36B for forming the small gap portions G1, G2 in which the heat transfer filling material 13 is filled and coated; and the circuit board 40B is formed with the via holes 57a which communicate with the front and back surfaces thereof to connect interlayer patterns, and some of the via holes 57a and the front and back surfaces of the circuit board 40B except for solder connection portions are formed with the solder resist film 49 defined so that the coefficient of heat radiation is 0.6 to 1.0.

As described above, with reference to Claim 9 of the present invention, the heat transfer mechanism 12B is configured by the board pass through portion 53 in which the central projection portion 37 formed on the heat transfer base portion 35B is disposed opposite to the heating component 43Ba, the solder resist film 49 having high coefficient of heat radiation is formed on the circuit board 40B, and air-permeable properties between the front and back surfaces of the circuit board 40B are maintained by the via holes 57a.

Therefore, the above configuration is characterized in that direct heat transfer from the heating component 43Ba to the heat transfer base portion 35B and heat radiation properties from the solder resist film 49 formed on substantially the whole surface of the circuit board 40B are improved; and a temperature difference between hermetic spaces of the front and back surfaces of the circuit board 40B is reduced and uniformized, and even when there is a difference in temperature circumstances at the outer surface of the cover 20 or the outer surface of the base 30, heat dissipation to either low temperature circumstance side is enhanced and averaged stable heat dissipation can be performed without depending on only either heat dissipation.

Embodiment 4

Figure 15:
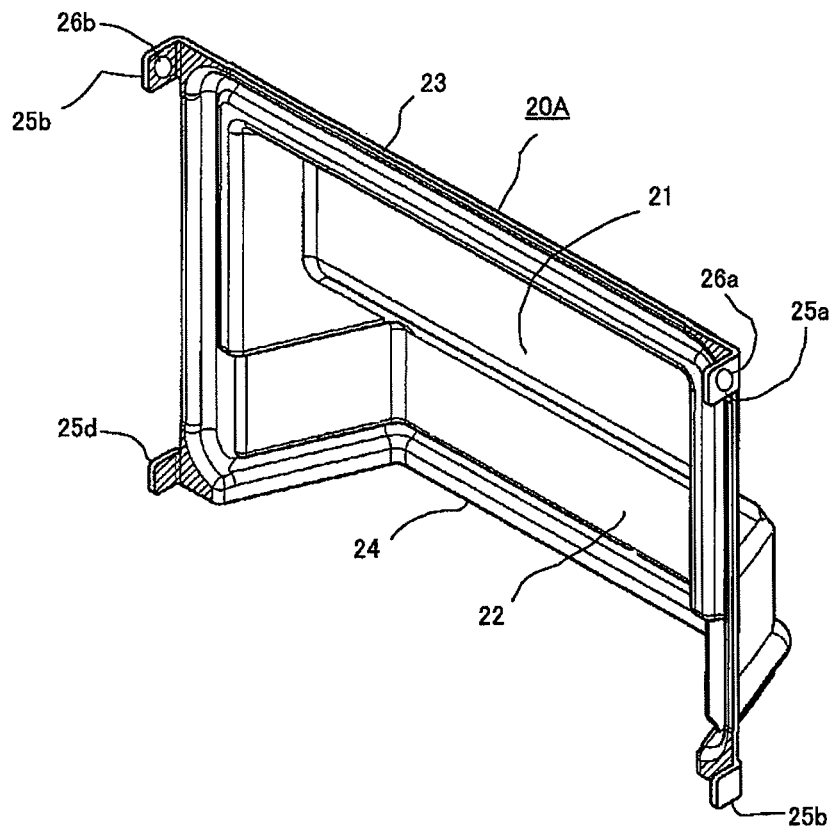
FIG. 15(A) is a view showing a cover in a board housing case for a vehicle-mounted electronic device according to Embodiment 4 of the present invention.
FIGS. 15(B), 15(C) are cross-sectional views each showing an isolated base portion.
Figure 15:
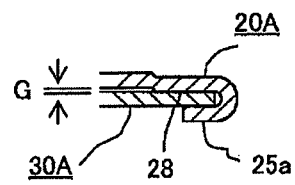
Figure 15:
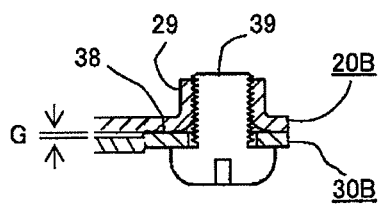

Embodiment 4 of the present invention will be described with reference to FIGS. 15(A), 15(B), 15(C). FIG. 15(A) is a view showing a cover in a board housing case for a vehicle-mounted electronic device according to Embodiment 4 of the present invention, and FIGS. 15(B), 15(C) are cross-sectional views each showing an isolated base portion. Incidentally, Embodiment 4 represents detail of the portion in which the cover 20 and the base 30 are fixed with each other in the aforementioned Embodiment 1, descriptions of other reference numerals are directly incorporated into this embodiment or identified by identified by a reference letter B assigned thereto. Furthermore, FIG. 15(A) is a bird's-eye view of the inner surface of a cover 20A; FIG. 15(B) is a partially enlarged view in which the cover 20A and a base 30A are integrated; and FIG. 15(C) is a partially enlarged view in which a cover 20B and a base 30B are integrated in other embodiment.

In FIG. 15(A), the cover 20A has a short flat portion 21, a tall flat portion 22, an outline peripheral portion 23, a partial peripheral portion 24, and folded pieces 25a to 25d provided at four corners; and the whole of the inner surfaces of the short flat portion 21 and the tall flat portion 22 or at least a partial region of the short flat portion 21 is coated with dark base paint. However, regions of four corners including the folded pieces 25a to 25d (shown by oblique lines) are bare portions that are not coated.

In FIG. 15(B), the cover 20A and the base 30A are integrated by folding the folded pieces 25a to 25d (25b to 25d are not shown in the drawing); however, surfaces coming into contact with the cover 20A and the base 30A constitute isolated base portions 28 and a seal gap G for coating sealant 11a to 11c (see FIG. 3) is secured by the isolated base portion 28.

The surfaces coming into contact by the isolated base portions 28 are the bare portions shown by the oblique lines in FIG. 15(A); and the cover 20A is in electrically conductive contact with the base 30A by the bare portions.

In FIG. 15(C), the cover 20B and the base 30B are clamped and fixed by a fixing screw 39 without depending on the folded pieces 25a to 25d. Embossed portions 29 are provided at four corners on the cover 20B in place of the folded pieces 25a to 25d; and an internal thread is formed on the inner circumference of the embossed portion 29 so as to screw the fixing screw 39. Isolated base portions 38 are provided at four corners of the base 30B and a seal gap G for coating sealant 11a to 11c (see FIG. 3) is secured by the isolated base portions 38.

The surfaces coming into contact by the isolated base portions 38 are the bare portions that are not coated; and the cover 20B is in electrically conductive contact with the base 30B by the bare portions.

As is apparent from the aforementioned description, according to Embodiment 4 of the present invention, there is provided the board housing case 10 for the vehicle-mounted electronic device, the board housing case 10 being for the circuit board 40, 40A, 40B which is mounted with the heating component 43a, 43Aa, 43Ba and the external connection connector 42 on the first board surface 43 thereof, the circuit board 40, 40A, 40B being hermetically-sealed and held in sandwiched relation in the case that is composed of the metal base 30A, 30B and the metal cover 20A, 20B, and the circuit board 40, 40A, 40B making the end surface of the resin connector housing 41 expose on the side of the case. The base 30A, 30B has a material thickness that is a thickness dimension equal to or more than the material thickness of the cover 20A, 20B, the base 30A, 30B is provided with the mounting legs 31, 32 for the purpose of being fixed and installed to a surface to be mounted, the base 30A, 30B is fixed and installed to the surface to be mounted via the mounting legs 31, 32, and the base 30A, 30B is disposed opposite to the second board surface 44 of the circuit board 40, 40A, 40B; the cover 20A, 20B has the tall flat portion 22 which is disposed opposite to the first board surface 43 of the circuit board 40, 40A, 40B and is disposed opposite to the connector housing 41, and the short flat portion 21 which is disposed opposite to the heating component 43a, 43Aa, 43Ba; the cover 20A, 20B and the base 30A, 30B have the outline peripheral portions 23, 33 coming into contact with each other via the waterproof sealant 11a, and the partial peripheral portions 24, 34 coming into contact with the peripheral portion of the connector housing 41 via the sealant 11b, 11c; the heating component 43a, 43Aa, 43Ba is thermally coupled with respect to the heat transfer base portion 35, 35A, 35B of the base 30A, 30B via the heat transfer mechanism 12, 12A, 12B by the heat transferring through holes 47a or the board pass through portion 53 passing through the circuit board 40, 40A, 40B and small gap portions G1, G2 in which the heat transfer filling material 13 is filled, and quality of material or color tone of exterior material of the heating component 43a, 43Aa, 43Ba has a coefficient of heat radiation of 0.7 to 1.0; and the short flat portion 21, which is the inner surface of the cover 20A, 20B and is disposed opposite to at least the heating component 43a, 43Aa, 43Ba with the gap therebetween, is surface-finished to provide a coefficient of heat radiation of 0.7 to 1.0.

The first board surface 43 of the circuit board 40, 40A, 40B is mounted with a plurality of first small heating components 43b serving as low-capacity heating components each disposed opposite to the inner surface of the cover 20A, 20B with a gap therebetween; and the surface finishing to be applied to the interior surface of the cover 20A, 20B is applied to surfaces disposed opposite to the heating component 43a, 43Aa, 43Ba and the first small heating components 43b, or to the whole of the inner surface of the short flat portion 22. The surface finishing is not applied to at least a joint contact surface with the base 30A, 30B even when the surface finishing is applied to the whole of the inner surface of the cover 20A, 20B. Plural points of the cover 20A, 20B or the base 30A, 30B become contact surfaces with respect to the base 30A, 30B or the cover 20A, 20B to provide the isolated base portions 28, 38 for determining the thickness dimension of the sealant 11a, and the contact surface is not coated with the dark paint so as to be in electrically contact and conductive.

As described above, with reference to Claim 4 of the present invention, the inner surface of the cover 20A, 20B is widely coated with dark paint, and the sealant 11a to 11c between the cover 20A, 20B and the base 30A, 30B is determined in the gap dimension by the uncoated isolated base portion 28, 38.

Therefore, the above configuration is characterized in that the thickness dimension of the sealant 11a to 11c becomes constant and the cover 20A, 20B is electrically integrated and in electrically contact with the base 30A, 30B; and accordingly, breakage of an electronic component due to electrostatic induction and the occurrence of erroneous operation of a control circuit are suppressed.

While the presently preferred embodiments of the present invention have been shown and described. It is to be understood that these disclosures are for the purpose of illustration and that various changes and modifications may be made without departing from the scope of the invention as set forth in the appended claims.

What is claimed is:

1. A board housing case for a vehicle-mounted electronic device, said board housing case being for housing a circuit board which is mounted with a heating component and an external connection connector on a first board surface thereof, said circuit board being hermetically-sealed and held in sandwiched relation in said case that is composed of a metal base and a metal cover, and said circuit board making an end surface of a resin connector housing expose on a side of said case, wherein said base has a material thickness that is a thickness dimension equal to or more than the material thickness of said cover, said base is provided with mounting legs for the purpose of being fixed and installed to a surface to be mounted, and said base is disposed opposite to a second board surface of said circuit board;

said cover has a tall flat portion which is disposed opposite to the first board surface of said circuit board and is disposed opposite to said connector housing, and a short flat portion which is disposed opposite to said heating component;

said cover and said base have outline peripheral portions coming into contact with each other via sealant, and partial peripheral portions coming into contact with a peripheral portion of said connector housing via said sealant;

said heating component is thermally coupled with respect to a heat transfer base portion of said base via a heat transfer mechanism and a small gap portion in which a heat transfer filling material is filled, and said heating component has a coefficient of heat radiation of 0.7 to 1.0; and the short flat portion which is the inner surface of said cover and is disposed opposite to at least said heating component with a gap therebetween is surface-finished to provide a coefficient of heat radiation of 0.7 to 1.0.

2. The board housing case for the vehicle-mounted electronic device according to claim 1,
wherein a gap dimension between the inner surface of the tall flat portion of said cover and the first board surface of said circuit board and a gap dimension between the inner surface of said short flat portion and the first board surface are formed with a difference in height of 1.5 to 2.5 times, and the surfaces having the difference in height being connected by a steep gradient having a tilt angle of not less than 45 degrees.

3. The board housing case for the vehicle-mounted electronic device according to claim 1,
wherein the surface finishing to be applied to the interior surface of said cover is one in which a dark base sheet is stuck or dark base paint is sprayed, stamp-coated, or brush-coated; and a region of the surface finishing has an area in which a flat region opposite to said heating component is defined as the lower limit and a flat region in which a gap dimension to said heating component is extended in four directions with respect to the lower limit region is defined as the upper limit.

4. The board housing case for the vehicle-mounted electronic device according to claim 2,
wherein the surface finishing to be applied to the interior surface of said cover is one in which a dark base sheet is stuck or dark base paint is sprayed, stamp-coated, or brush-coated; and a region of the surface finishing has an area in which a flat region opposite to said heating component is defined as the lower limit and a flat region in which a gap dimension to said heating component is extended in four directions with respect to the lower limit region is defined as the upper limit.

5. The board housing case for the vehicle-mounted electronic device according to claim 1,
wherein the first board surface of said circuit board is mounted with a plurality of first small heating components serving as low-capacity heating components each disposed opposite to the inner surface of said cover with a gap therebetween;
the surface finishing to be applied to the interior surface of said cover is applied to surfaces disposed opposite to said heating component and said first small heating components, or to the whole of the inner surface of said short flat portion, and the surface finishing is not applied to at least a joint contact surface with said base even when the surface finishing is applied to the whole of the inner surface of said cover; and
plural points of said cover or said base become contact surfaces with respect to said base or said cover to provide isolated base portions for determining a thickness dimension of said sealant, and the contact surface is not coated with dark paint so as to be in electrically contact and conductive.

6. The board housing case for the vehicle-mounted electronic device according to claim 2,
wherein the first board surface of said circuit board is mounted with a plurality of first small heating components serving as low-capacity heating components each disposed opposite to the inner surface of said cover with a gap therebetween;
the surface finishing to be applied to the interior surface of said cover is applied to surfaces disposed opposite to said heating component and said first small heating components, or to the whole of the inner surface of said short flat portion, and the surface finishing is not applied to at least a joint contact surface with said base even when the surface finishing is applied to the whole of the inner surface of said cover; and
plural points of said cover or said base become contact surfaces with respect to said base or said cover to provide isolated base portions for determining a thickness dimension of said sealant, and the contact surface is not coated with dark paint so as to be in electrically contact and conductive.

7. The board housing case for the vehicle-mounted electronic device according to claim 1,
wherein the first board surface of said circuit board is mounted with a plurality of first small heating components serving as low-capacity heating components each disposed opposite to the inner surface of said cover with a gap therebetween;
the surface finishing to be applied to the interior surface of said cover is fully coated with dark paint to at least the inner surface of said cover; and
said cover is provided with folded pieces to be caulked and fixed to said base at four corners thereof, and some of said folded pieces are formed with an unloaded hole to which a carrying suspender is inserted when said cover is fully coated.

8. The board housing case for the vehicle-mounted electronic device according to claim 2,
wherein the first board surface of said circuit board is mounted with a plurality of first small heating components serving as low-capacity heating components each disposed opposite to the inner surface of said cover with a gap therebetween;
the surface finishing to be applied to the interior surface of said cover is fully coated with dark paint to at least the inner surface of said cover; and
said cover is provided with folded pieces to be caulked and fixed to said base at four corners thereof, and some of said folded pieces are formed with an unloaded hole to which a carrying suspender is inserted when said cover is fully coated.

9. The board housing case for the vehicle-mounted electronic device according to claim 1,
wherein the second board surface of said circuit board is mounted with a plurality of second small heating components serving as low-capacity heating components each disposed opposite to the inner surface of said base with a gap therebetween, and the whole of the inner surface of said base is coated with thermally conductive dark paint including metal oxide or ceramic-based heat transfer filler to provide a coefficient of heat radiation of 0.7 to 1.0.

10. The board housing case for the vehicle-mounted electronic device according to claim 2,
wherein the second board surface of said circuit board is mounted with a plurality of second small heating components serving as low-capacity heating components each disposed opposite to the inner surface of said base with a gap therebetween, and the whole of the inner surface of said base is coated with thermally conductive dark paint including metal oxide or ceramic-based heat transfer filler to provide a coefficient of heat radiation of 0.7 to 1.0.

11. The board housing case for the vehicle-mounted electronic device according to claim 1, wherein the heat transfer base portion is located at a position just proximal to the outline peripheral portion of said base;

said sealant to be filled in surfaces coming into contact with the outline peripheral portions of said cover and said base is the same material as said heat transfer filling material to be filled between said heating component and the heat transfer base portion, and said sealant is silicone resin including heat transfer filler that is electrically nonconductive; and the inner surfaces of the outline peripheral portions of said cover and said base are not coated or are coated with thermally conductive dark paint.

12. The board housing case for the vehicle-mounted electronic device according to claim 2, wherein the heat transfer base portion is located at a position just proximal to the outline peripheral portion of said base;

said sealant to be filled in surfaces coming into contact with the outline peripheral portions of said cover and said base is the same material as said heat transfer filling material to be filled between said heating component and the heat transfer base portion, and said sealant is silicone resin including heat transfer filler that is electrically nonconductive; and the inner surfaces of the outline peripheral portions of said cover and said base are not coated or are coated with thermally conductive dark paint.

13. The board housing case for the vehicle-mounted electronic device according to claim 1, wherein said heat transfer mechanism is composed of a plurality of heat transferring through holes each having a plated layer for thermally coupling a first heat transfer pattern which is provided on the first board surface and to which a heat dissipating electrode of said heating component is soldered and a second heat transfer pattern which is provided on the second board surface;

the heat transfer base portion is formed with an isolated projection portion for forming the small gap portion in which said heat transfer filling material is filled and coated; and said circuit board is formed with via holes which communicate with the front and back surfaces thereof to connect interlayer patterns, and some of the via holes and the front and back surfaces of said circuit board except for solder connection portions are formed with a solder resist film defined so that the coefficient of heat radiation is 0.6 to 1.0.

14. The board housing case for the vehicle-mounted electronic device according to claim 2, wherein said heat transfer mechanism is composed of a plurality of heat transferring through holes each having a plated layer for thermally coupling a first heat transfer pattern which is provided on the first board surface and to which a heat dissipating electrode of said heating component is soldered and a second heat transfer pattern which is provided on the second board surface;

the heat transfer base portion is formed with an isolated projection portion for forming the small gap portion in which said heat transfer filling material is filled and coated; and said circuit board is formed with via holes which communicate with the front and back surfaces thereof to connect interlayer patterns, and some of the via holes and the front and back surfaces of said circuit board except for solder connection portions are formed with a solder resist film defined so that the coefficient of heat radiation is 0.6 to 1.0.

15. The board housing case for the vehicle-mounted electronic device according to claim 1, wherein said heat transfer mechanism is configured by a board pass through portion to which a central projection portion formed on the heat transfer base portion is inserted and disposed opposite to a die pad of said heating component;

the heat transfer base portion is formed with an isolated projection portion for forming small gap portions in which said heat transfer filling material is filled and coated; and said circuit board is formed with via holes which communicate with the front and back surfaces thereof to connect interlayer patterns, and some of the via holes and the front and back surfaces of said circuit board except for solder connection portions are formed with a solder resist film defined so that the coefficient of heat radiation is 0.6 to 1.0.

16. The board housing case for the vehicle-mounted electronic device according to claim 2, wherein said heat transfer mechanism is configured by a board pass through portion to which a central projection portion formed on the heat transfer base portion is inserted and disposed opposite to a die pad of said heating component;

the heat transfer base portion is formed with an isolated projection portion for forming small gap portions in which said heat transfer filling material is filled and coated; and said circuit board is formed with via holes which communicate with the front and back surfaces thereof to connect interlayer patterns, and some of the via holes and the front and back surfaces of said circuit board except for solder connection portions are formed with a solder resist film defined so that the coefficient of heat radiation is 0.6 to 1.0.

* * * * *